US010832791B2

(12) United States Patent
Wilson

(10) Patent No.: US 10,832,791 B2
(45) Date of Patent: Nov. 10, 2020

(54) APPARATUSES AND METHODS FOR SOFT POST-PACKAGE REPAIR

(71) Applicant: MICRON TECHNOLOGY, INC., Boise, ID (US)

(72) Inventor: Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/256,796

(22) Filed: Jan. 24, 2019

(65) Prior Publication Data

US 2020/0243158 A1 Jul. 30, 2020

(51) Int. Cl.
*G11C 29/02* (2006.01)
*G11C 29/32* (2006.01)
(Continued)

(52) U.S. Cl.
CPC .............. *G11C 29/76* (2013.01); *G11C 7/106* (2013.01); *G11C 7/109* (2013.01); *G11C 7/1063* (2013.01); *G11C 7/1087* (2013.01); *G11C 7/222* (2013.01); *G11C 11/4076* (2013.01); *G11C 11/4087* (2013.01); *G11C 17/18* (2013.01); *G11C 29/025* (2013.01); *G11C 29/32* (2013.01); *G11C 29/789* (2013.01); *G11C 2029/4402* (2013.01)

(58) Field of Classification Search
CPC ....... G11C 29/76; G11C 7/1063; G11C 7/106; G11C 7/1087; G11C 7/109; G11C 7/222; G11C 11/4076; G11C 11/4087; G11C 17/18; G11C 29/025; G11C 29/32; G11C 29/789
See application file for complete search history.

(56) References Cited

U.S. PATENT DOCUMENTS 3,886,323 A 5/1975 Miller et al.
5,278,839 A 1/1994 Matsumoto et al.
(Continued)

FOREIGN PATENT DOCUMENTS

CN 1784758 A 6/2006
CN 1945744 A 4/2007
(Continued)

OTHER PUBLICATIONS

U.S. Appl. No. 16/161,932, titled "Intelligent Post-Packaging Repair", filed Oct. 16, 2018.
(Continued)

*Primary Examiner* — Tri M Hoang
(74) *Attorney, Agent, or Firm* — Dorsey & Whitney LLP

(57) ABSTRACT

Embodiments of the disclosure are drawn to apparatuses and methods for soft post-package repair (SPPR). After packaging, it may be necessary to perform post-package repair operations on rows of the memory. During a scan mode of an SPPR operation, addresses provided by a fuse bank may be examined to determine if they are open addresses or if the bad row of memory is a redundant row of memory. The open addresses and the bad redundant addresses may be stored in volatile storage elements, such as in latch circuits. During a soft send mode of a SPPR operation, the address previously associated with the bad row of memory may be associated with the open address instead, and the address of the bad redundant row may be disabled.

8 Claims, 8 Drawing Sheets

(51) Int. Cl.
*G11C 17/18* (2006.01)
*G11C 11/408* (2006.01)
*G11C 7/22* (2006.01)
*G11C 7/10* (2006.01)
*G11C 11/4076* (2006.01)
*G11C 29/00* (2006.01)
*G11C 29/44* (2006.01)

(56) References Cited

U.S. PATENT DOCUMENTS

| | | | |
|---|---|---|---|
| 5,764,878 | A | 6/1998 | Kablanian et al. |
| 5,862,314 | A | 1/1999 | Jeddeloh |
| 5,910,921 | A | 6/1999 | Beffa et al. |
| 5,930,169 | A | 7/1999 | Iwata et al. |
| 5,974,564 | A | 10/1999 | Jeddeloh |
| 6,085,334 | A | 7/2000 | Giles et al. |
| 6,367,030 | B1 | 4/2002 | Yamauchi |
| 6,490,219 | B2 | 12/2002 | Yoneya et al. |
| 6,665,226 | B2 | 12/2003 | Yoneya et al. |
| 6,967,878 | B2 | 11/2005 | Dona |
| 7,020,033 | B2 | 3/2006 | Nagata et al. |
| 7,350,119 | B1 | 3/2008 | Zuraski, Jr. et al. |
| 7,436,222 | B2 | 10/2008 | Shyr et al. |
| 7,437,626 | B2 | 10/2008 | Chang et al. |
| 7,535,780 | B2 | 5/2009 | Lee |
| 7,536,267 | B2 | 5/2009 | Zimmerman et al. |
| 7,606,102 | B2 | 10/2009 | Blodgett |
| 7,684,266 | B2 | 3/2010 | Lee |
| 7,746,712 | B2 | 6/2010 | Kang et al. |
| 7,768,847 | B2 | 8/2010 | Ong et al. |
| 8,086,916 | B2 | 12/2011 | Kopel |
| 8,379,460 | B2 | 2/2013 | Jeong |
| 8,559,258 | B1 | 10/2013 | Stephens, Jr. |
| 8,593,891 | B2 | 11/2013 | Nishioka et al. |
| 8,645,583 | B2 | 2/2014 | Vu et al. |
| 9,202,595 | B2 | 12/2015 | Wilson et al. |
| 9,343,184 | B2 * | 5/2016 | Wilson ............... G11C 29/70 |
| 9,349,491 | B1 * | 5/2016 | Morgan ............. G11C 29/76 |
| 9,418,762 | B1 * | 8/2016 | You ................... G11C 29/78 |
| 9,514,849 | B2 * | 12/2016 | You ................... G11C 29/78 |
| 9,570,201 | B2 | 2/2017 | Morgan et al. |
| 9,666,307 | B1 * | 5/2017 | Fujiwara .......... G11C 29/76 |
| 9,741,403 | B2 | 8/2017 | Wilson et al. |
| 9,805,828 | B1 * | 10/2017 | Yoko ................. G11C 17/16 |
| 9,922,729 | B2 | 3/2018 | Wilson et al. |
| 2002/0051400 | A1 | 5/2002 | Yoneya et al. |
| 2002/0133769 | A1 | 9/2002 | Cowles et al. |
| 2003/0031075 | A1 | 2/2003 | Yoneya et al. |
| 2003/0038649 | A1 | 2/2003 | D'Angelo |
| 2004/0047192 | A1 | 3/2004 | Haga |
| 2004/0261049 | A1 | 12/2004 | Mohr et al. |
| 2005/0041491 | A1 | 2/2005 | Kyung |
| 2005/0097383 | A1 | 5/2005 | Puri et al. |
| 2005/0149782 | A1 | 7/2005 | McPartland |
| 2006/0274594 | A1 | 12/2006 | Huckaby et al. |
| 2007/0183229 | A1 | 8/2007 | Choi et al. |
| 2009/0282301 | A1 | 11/2009 | Flynn et al. |
| 2010/0046292 | A1 | 2/2010 | Hahn et al. |
| 2010/0124132 | A1 | 5/2010 | Sarin et al. |
| 2011/0110164 | A1 | 5/2011 | Jeong |
| 2011/0199811 | A1 | 8/2011 | Kanno et al. |
| 2012/0027077 | A1 | 2/2012 | Reznik |
| 2012/0054549 | A1 | 3/2012 | Kwan et al. |
| 2012/0069638 | A1 | 3/2012 | Matsuda et al. |
| 2012/0069685 | A1 | 3/2012 | Ide et al. |
| 2012/0092943 | A1 | 4/2012 | Nishioka |
| 2012/0195144 | A1 | 8/2012 | Ide et al. |
| 2012/0267791 | A1 | 10/2012 | Lee et al. |
| 2013/0055039 | A1 | 2/2013 | Dearth |
| 2013/0083612 | A1 | 4/2013 | Son et al. |
| 2013/0223171 | A1 | 8/2013 | Kim et al. |
| 2013/0235644 | A1 | 9/2013 | Chung |
| 2013/0339821 | A1 | 12/2013 | Cordero et al. |
| 2014/0049854 | A1 | 2/2014 | Ho |
| 2014/0078842 | A1 | 3/2014 | Oh et al. |
| 2014/0140138 | A1 | 5/2014 | Tran et al. |
| 2014/0211567 | A1 | 7/2014 | Chung |
| 2014/0223257 | A1 | 8/2014 | Oh et al. |
| 2015/0135038 | A1 | 5/2015 | Wilson et al. |
| 2015/0277790 | A1 | 10/2015 | Mozak et al. |
| 2015/0287480 | A1 | 10/2015 | Wilson et al. |
| 2016/0078968 | A1 * | 3/2016 | Park .................. G11C 29/78 |
| | | | 365/96 |
| 2016/0133310 | A1 | 5/2016 | Wilson et al. |
| 2016/0232987 | A1 | 8/2016 | Wilson et al. |
| 2016/0300627 | A1 * | 10/2016 | You ................... G11C 29/78 |
| 2016/0307647 | A1 | 10/2016 | Morgan et al. |
| 2017/0098480 | A1 | 4/2017 | Wilson et al. |
| 2018/0005710 | A1 | 1/2018 | Wilson et al. |
| 2018/0102185 | A1 * | 4/2018 | Yang ................. G11C 29/78 |
| 2018/0166152 | A1 * | 6/2018 | Lee ................... G11C 29/76 |
| 2018/0240534 | A1 * | 8/2018 | Yoko ................. G11C 17/16 |
| 2018/0261297 | A1 * | 9/2018 | Kim .................. G11C 29/84 |

FOREIGN PATENT DOCUMENTS

| | | |
|---|---|---|
| CN | 101211656 A | 7/2008 |
| CN | 101253576 A | 8/2008 |
| CN | 201828258 U | 5/2011 |
| CN | 103295640 A | 9/2013 |
| JP | 2002117694 A | 4/2002 |
| JP | 2012083243 A | 4/2012 |
| WO | 2016077248 A1 | 5/2016 |

OTHER PUBLICATIONS

"Impact of I/O Settings on Signal Integrity in Stratix III Devices", Altera Corporation, Application Note 476, ver. 1.0, 15 pgs, Oct. 2007.

Cataldo, Anthony , ""Virage Logic Readies self-repairing embedded memory"", EE Times, Mar. 6, 2001, 2 pages. Available at: http://www.eetimes.com/document.asp?doc_id=1143164&print=yes (accessed, Apr. 10, 2014).

Cataldo, Anthony , ""Virage Logic Readies self-repairing embedded memory"", EE Times, Mar. 6, 2001, 2 pages. Available at: http:/www.eetimes.com/document.asp?doc_id=1143164&print=yes (accessed, Apr. 10, 2014)., Mar. 6, 2001, 2 pages.

Cataldo, Anthony , ""Virage Logic Readies self-repairing embedded memory,"", EE Times, Mar. 6, 2001, 2 pages, Mar. 6, 2001.

* cited by examiner

US 10,832,791 B2

APPARATUSES AND METHODS FOR SOFT POST-PACKAGE REPAIR

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations on a row-by-row basis. A row containing a failed memory cell (which may be referred to as a defective row, a bad row, or a faulty row) may be identified. The memory device may contain additional rows of memory (which may also be referred to as redundant rows) which may be used in repair operations. During a repair operation, an address associated with the defective row may be redirected, such that the address points to a redundant row instead. It may be desirable to increase the flexibility of repair operations, such that repairs may be tested before they are permanently implemented on the memory device.

DETAILED DESCRIPTION

Figure 1:
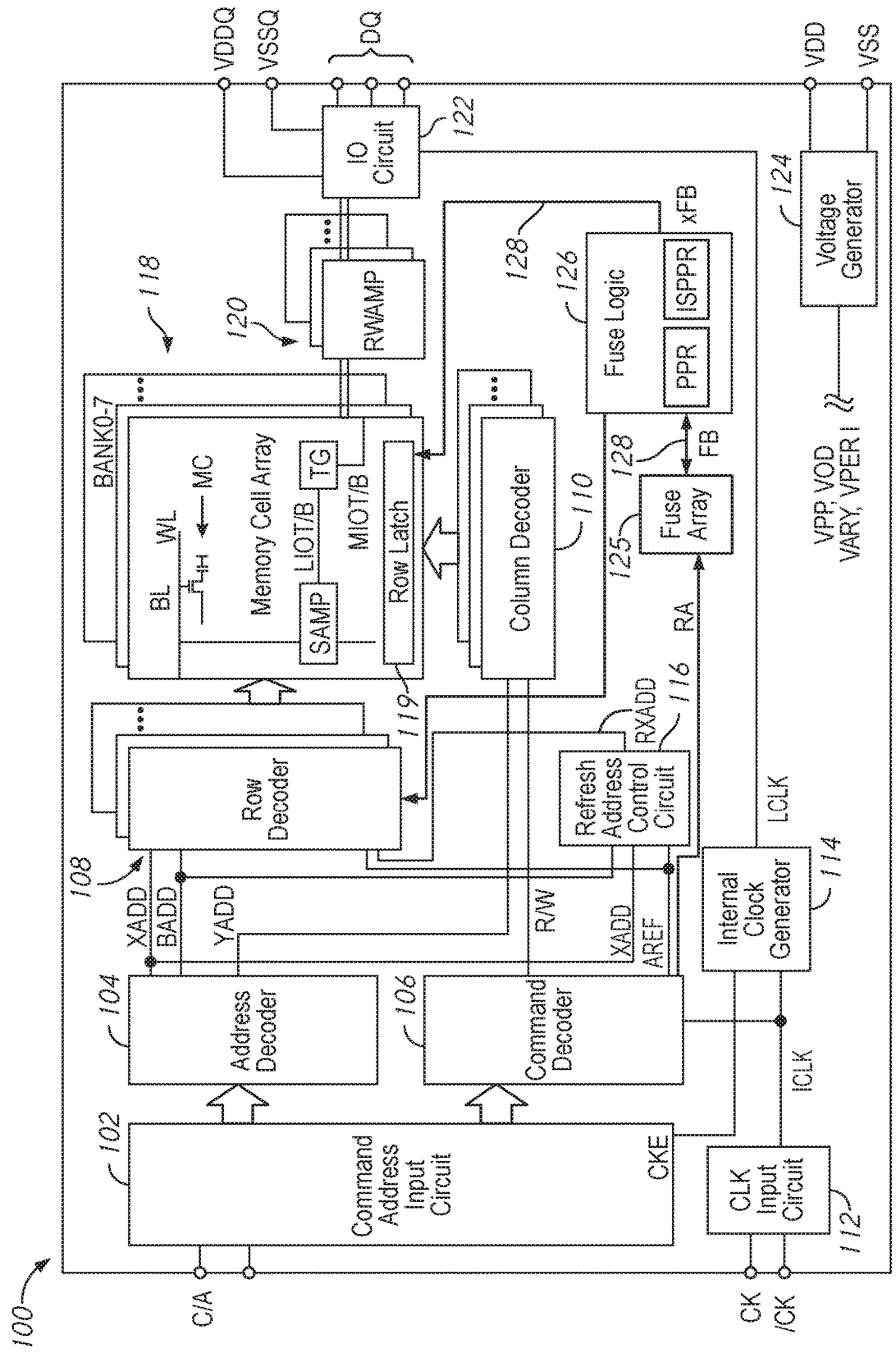
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

Certain memory cells may be defective, and rows containing the defective memory cells may generally be referred to as defective rows (or bad rows or faulty rows). The defective rows may be incapable of storing information and/or may become otherwise inaccessible to the memory device. In some cases, memory may become defective (and/or may be identified as defective) after the memory device is packaged (e.g., sealed in a chip package). The memory device may carry out one or more types of post-package repair (PPR) operation to resolve the defective rows.

For example, memory banks may generally include a number of additional rows of memory, which may generally be referred to as redundant rows. During a repair operation, a row address associated with a defective row may be redirected so that it is associated with one of the redundant rows instead. In some modes of operation, the repair operation may be a hard (or permanent) repair operation, where updated row address information is stored in the memory in a non-volatile form (e.g., stored in a manner that is maintained even when the memory device is powered down). For example, the memory device may include fuse banks, which may include fuses (and/or anti-fuses) which may have state that can be permanently changed (e.g., when the fuse/anti-fuse is "blown"). The state of the fuses/anti-fuses in the fuse bank may, in part, determine which addresses are associated with which rows of memory. It may be both time and power intensive to blow a fuse/anti-fuse, and thus it may be desirable to perform repairs using volatile memory, in order to test non-permanent repairs. In addition, it may be desirable to move the logic associated with a repair operation outside of the logic circuits associated with the memory banks.

The present disclosure is generally directed to soft post package repair (SPPR). In a SPPR operation, there may be a set of volatile memory elements (for example, latch circuits organized in a latch bank) which may be used to store updated addresses during a repair operation. The memory device may include a fuse logic circuit which is coupled to the memory banks. The fuse logic may monitor the fuse bus between the fuse array and the row latches, and may store addresses for groups of fuses in the fuse array (fuse band addresses) in the volatile memory elements for later SPPR repairs. The fuse logic may compare the fuse bank addresses in the volatile memory elements to the data on the fuse bus, and may alter the addresses on the fuse bus based on that comparison in order to perform the SPPR repairs. In this manner, the fuse logic circuit may perform SPPR operations by storing addresses in volatile memory elements and making changing addresses along the fuse bus based on those stored addresses.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements which may store information about addresses in the memory array 118. The fuse array 125 includes non-volatile storage elements, such as fuses or anti-fuses. Each fuse may be in a first state where it is conductive, and may be 'blown' to make the fuse insulating instead. Each anti-fuse may be in a first state which is non-conductive, until it is blown to make the anti-fuse conductive instead. Each fuse/anti-fuse may permanently change when it is blown. Each fuse/anti-fuse may be considered to be a bit, which is in one state before it is blown, and permanently in a second state after it's blown. For example, a fuse may represent a logical low before it is blown and a logical high after it is blown, while an anti-fuse may represent a logical high before it is blown and a logical low after it is blown.

Specific groups of fuses/anti-fuses may be represented by a fuse bank address FBA, which may specify the physical location of each of the fuses/anti-fuses in the group within the fuse array 125. The group of fuses/anti-fuses associated with a particular FBA may in turn encode an address associated with one or more memory cells of the memory array 118. For example, a group of fuses/anti-fuses may represent a row address. The address information in the fuse array 125 may be 'scanned' out along a fuse bus (FB and xFB) 128 to row latches 119. Each row latch 119 may be associated with a particular wordline of the memory array 118. In some embodiments, only the redundant rows of the memory array 118 (e.g., the rows designated for use in repair operations) may be associated with one of the row latches 119. The address stored in a given group of fuses/anti-fuses may be scanned out from the fuse array 125 along the fuse bus 128, and may be latched by a particular row latch 119. In this manner, an address stored in the fuse array 125 may be associated with a particular row of the memory array 118. The address stored in the row latch 119 may then direct access commands to the wordlines associated with the row latch 119.

A fuse logic circuit 126 may be positioned along the fuse bus 128. The fuse logic circuit 126 may include post package repair (PPR) circuits (e.g., hard PPR circuits) which may be used to make changes to the fuse array 125. For example, the PPR circuits may perform a hard repair, where fuses/anti-fuses in the fuse array are blown to 'repair' a row. As described in more detail herein, the fuse logic circuit 126 may also include softsoft PPR circuits (SPPR circuits) and volatile memory elements which may be used to make non-permanent repairs. The fuse logic circuit 126 may monitor the data along the fuse bus 128 and may selectively alter the data to provide an altered fuse bus xFB.

A row address RA associated with a defective row of memory may be provided to the fuse logic circuit 126. The fuse logic circuit 126 may be commanded to perform an SPPR operation. During a scan mode of the SPPR operation, the fuse logic circuit 126 may 'scan' the fuse array 125 to locate a fuse bank which is not yet associated with a repaired memory address (generally referred to as an open fuse bank). An address associated with the open fuse bank (e.g., an open fuse bank address) may then be stored in one of a set of volatile memory elements of the fuse logic circuit 126 (e.g., a latch bank). During the scan mode, the fuse logic circuit 126 may also perform other operations, such as determining if a redundant row of memory is itself a defective row of memory. Identified defective rows of redundant memory may also be saved in the latch bank (or a second latch bank) of the fuse logic circuit 126.

In some embodiments, if multiple addresses are stored in the latch banks (e.g., from previous SPPR operations), the fuse logic circuit 126 may perform a shift operation, where the addresses in the latch bank(s) may be shifted until a current address (e.g., the most recently stored open fuse bank address and/or bad redundant address) is in a primary latch circuit. The amount of shifts during the shift operation may be based on a count control circuit, which may track a number of previous SPPR operations. In some embodiments, there may be a first primary latch which holds an address of an open fuse bank and a second primary latch which holds an address of a defective redundant row.

The fuse logic circuit 126 may also perform a 'soft send' operation, in which the fuse logic circuit 126 changes address information stored in the row latches 119 of the memory. Each of the row latches 119 may store the row address associated with a physical row associated with the given row latch 119. The address in the row latch 119 may then be used to during operations to determine which physical row is associated with a given address. During the soft send operation, the fuse logic circuit 126 may compare the addresses broadcast on the fuse bus 128 to the address(es) stored in the primary latch(es). When there is a match, a multiplexer may alter the address being broadcast and cause the altered address to be latched in the row latch 119 instead. For example, the row address associated with the defective row of memory may be provided to a row latch 119 associated with the open fuse bank in the primary latch circuit. This may repair the row address RA such that it is now associated with the redundant row associated with the open fuse bank instead of the defective row it was previously associated with. If the address is associated with a defective redundant row, the address of the defective redundant row address may be changed to mark it as disabled.

In this manner, volatile memory elements may be used to non-permanently repair rows of the memory. The logic circuits to perform the SPPR operation may be located in the fuse logic circuit 126, which may offer space savings, as the fuse logic circuit 126 may be in a less congested area of the memory device 100 than logic circuits associated with the memory array 118, such as bank logic circuits. In addition, the use of a shift operation so that comparisons are made to addresses in a primary latch may reduce the number of comparator circuits, which may in turn reduce the complexity and size of the fuse logic circuits. Further since open fuse banks are scanned for and identified, there may be no need for redundant rows to be specifically designated for post-package repair operations. After a certain number of SPPR operations, the fuse logic circuit 126 may perform one or more hard PPR operations and may make permanent changes to the fuse array 125. In some embodiments, the hard PPR may be based on the repairs made during the SPPR operations.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic. In some embodiments, the refresh address control circuit 116 may perform both auto-refresh operations, where the wordlines of the memory array 118 are refreshed in a sequence, and targeted refresh operations, where specific wordlines of the memory are targeted for a refresh out of sequence from the auto-refresh operations.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
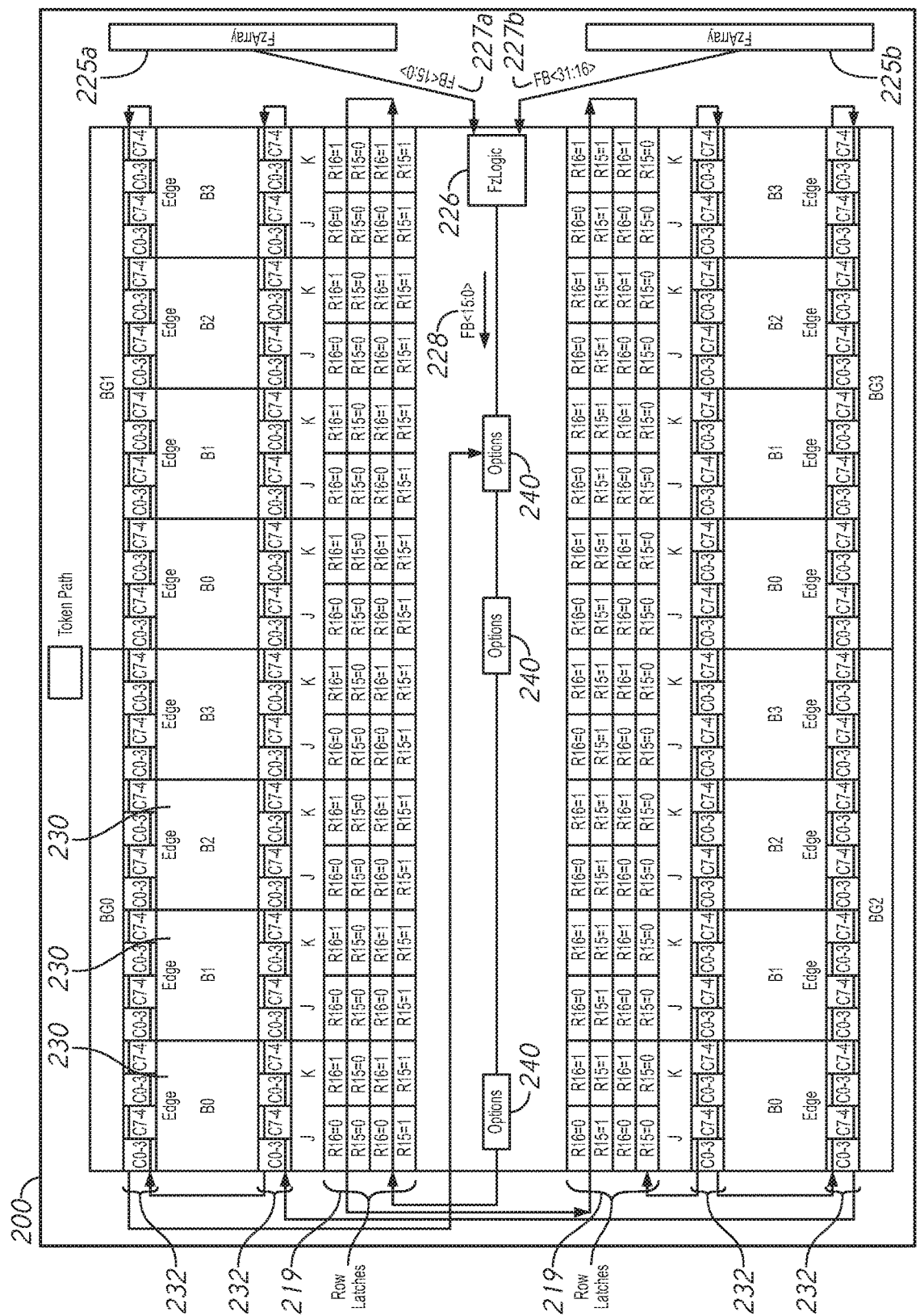
FIG. 2 is a block diagram representing a memory device according to an embodiment of the present disclosure.

FIG. 2 is a block diagram representing a memory device according to an embodiment of the present disclosure. FIG. 2 shows the transmission path of a fuse bus 228 from a pair of fuse arrays 225*a* and 225*b* through a memory array 200. In some embodiments, the memory array 200 may be an implementation of the memory array 118 of FIG. 1. However, the memory array 200 includes 16 banks 230 rather than the eight banks previously described with reference to the memory array 118. The 16 banks 230 are organized into four bank groups (BG0-BG3) of four banks 230 each. Each of the banks 230 is associated with a set of row latches 219 and column latches 232.

Addresses may be scanned out along a fuse bus 228 from the fuse array 225*a-b*. In the particular embodiment of FIG. 2, there may be a pair of fuse arrays 225*a* and 225*b*. The fuse array 225*a* may include a set of anti-fuses which may generally be used to store address information for a first portion of row addresses. The fuse array 225*b* may include a set of fuses which may generally be used to store address information for a second portion of row addresses. In some embodiments, the row addresses may be divided between the first portion and the second portion based on a numerical value assigned to the address. For example, the addresses may be sorted by numerical value, row addresses with the smaller values may be assigned to fuse array 225*a*, while row addresses with the larger values assigned to fuse array 225*b*. Since the value of the address may be expressed as a number in binary, for numbers with a high value, most of the bits of the number may be at a high logical level, while numbers with a low value may have most of the bits at a low logical level. Thus, it may be more efficient to store high value addresses in the fuse array 225*b*, which includes fuses that default to a high logical level and low value addresses in the fuse array 225*a*, which includes anti-fuses which default to a low logical level. Thus, a high value address assigned to the fuse array 225*b* may require less fuses to be blown than it would require anti-fuses to be blown in the fuse array 225*a*.

In some embodiments, the fuse array 225*a* may include anti-fuses, and may be a non-inverting fuse array (since the default value of the anti-fuses is a low logical level) and the fuse array 225*b* may include fuses and be an inverting fuse array. It may be necessary to 'invert' an address (e.g., swap low logical levels for high logical levels and vice versa) before providing an address based on the inverting fuse array 225*b*.

While the organization of fuse arrays 225*a* and 225*b* will continue to be discussed herein as an example implementation, it should be understood that other methods of organizing addresses in the fuse array(s) may be used in other embodiments. For example, a single fuse array may be used with only fuses, only anti-fuses, or a mix thereof.

During a broadcast operation, the fuse arrays 225*a-b* may broadcast the row addresses stored in the fuse arrays 225*a-b* along the fuse bus 228. The fuse array 225*a-b* may begin a broadcast operation as part of a scan mode of an SPPR operation, as discussed further herein. In the particular embodiment of FIG. 2, during the broadcast operation the fuse logic circuit 226 may receive a portion of the addresses along fuse bus portion 227*a* from the fuse array 225*a*, and a portion of the addresses along fuse bus portion 227*b* from the fuse array 225*b*. The fuse logic circuit 226 may combine the addresses onto the fuse bus 228 by alternating whether the addresses from the first fuse bus portion 227*a* or the second fuse bus portion 227*b* are provided along the fuse bus 228. For clarity, the addresses provided along the fuse bus portion 227*a* may be referred to as 'even' addresses and the addresses provided along the fuse bus portion 227*b* may be referred to as 'odd' addresses. It should be understood that even and odd addresses refers to the fuse array 225*a-b* the address is stored in, and that both fuse bus portions 227*a-b* may include addresses with numerical values which are both even and odd.

As previously described, the fuse logic circuit 226 may provide data along the fuse bus 228. The fuse logic circuit 226 may alternate between providing the even addresses from fuse bus portion 227*a* and the odd addresses from fuse bus portion 227*b* along the fuse bus 228. The fuse logic circuit 226 may also perform one or more operations based on the data of the fuse bus. For example, during a repair operation, the fuse logic 226 may change the value of a particular address as it streams past on the fuse bus 228.

After leaving the fuse logic circuit 226, the fuse bus 228 may pass data through one or more options circuits 240. The options circuits 240 may include various settings of the memory which may interact with the addresses along the fuse bus 228. For example, the options circuits 240 may include fuse settings, such as the test mode and power supply fuses. Data stored in the fuse arrays 225*a-b* may be latched and/or read by the options circuits 240, which may then determine one or more properties of the memory based on the options data provided along the fuse bus 228.

After passing through the options circuits 240 the fuse bus 228 may pass through the row latches 219 for all of the memory banks 230 before passing through the column latches 232 for all of the memory banks 230. As well as providing data (including address data) along the fuse bus 228, the fuse logic circuit 226 may also provide one or more select signals along the fuse bus 228. The select signals may be associated with a particular packet of data along the fuse bus, and may determine which circuit along the fuse bus 228 the particular packet of data is associated with. For example, if a row latch select signal is in an active state, it may indicate that the packet of data is to be stored in a row latch 219. In some embodiments, this may overwrite an address already stored in the row latch 219 with the address from the fuse bus 228. Further select signals may be used to specify a particular location of the specific row latch 219 which is intended to store the packet of data (e.g., a bank group select signal, a bank select signal, etc.).

By monitoring the data on the fuse bus 228, providing specific select signals, and selectively altering certain data on the fuse bus 228, the fuse logic circuit 226 may perform a variety of repair operations on the memory.

Figure 3:
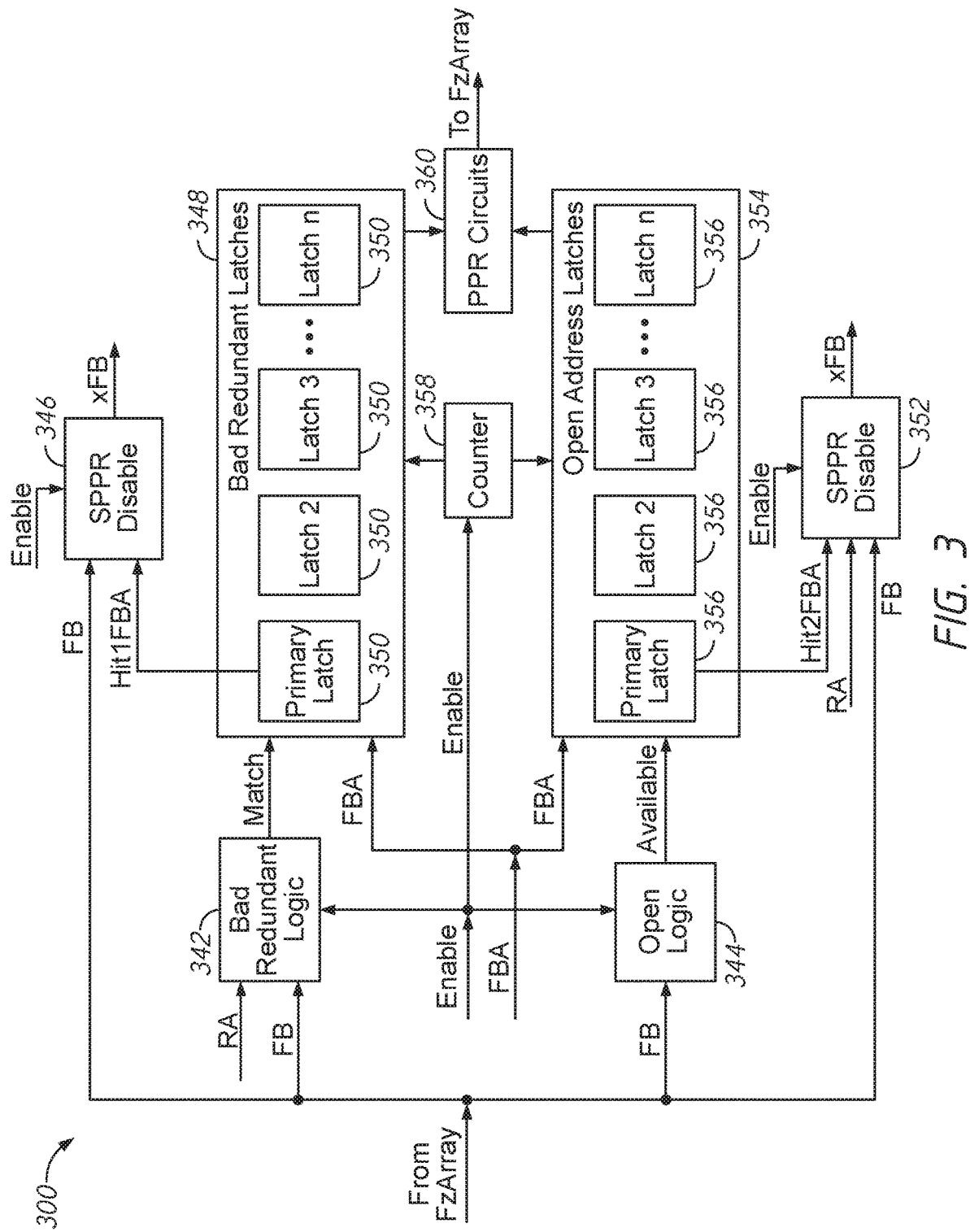
FIG. 3 is a block diagram depicting a fuse logic circuit according to an embodiment of the present disclosure.

FIG. 3 is a block diagram depicting a fuse logic circuit according to an embodiment of the present disclosure. In some embodiments the fuse logic circuit 300 may be used to implement the fuse logic circuit 126 of FIG. 1 and/or the fuse logic circuit 226 of FIG. 2. The fuse logic circuit 300 may be used to carry out an softsoft post-package repair (SPPR) operation. The SPPR operation may include receiving a row address RA of a bad row of the memory (e.g., a defective row of memory). During the SPPR operation, the fuse logic circuit may perform a scan mode operation and determine if the RA is itself a redundant row used in an earlier repair, indicating a bad redundant row and also may search for an open (e.g., unused) row of redundant memory. The fuse logic circuit 300 may then perform a soft send operation and disable an identified bad redundant row and repair the row address RA by assigning the row address RA to an unused row of redundant memory.

The fuse logic 300 includes a first logic circuit 342, which may generally be referred to as bad redundant logic circuit 342 and a first bank of latches 348, which may generally be referred to as the bad redundant latch bank 348. The bad redundant latch bank 348 includes one or more latch circuits (e.g., bad redundant latches) 350, which may store the fuse bank address FBA associated with bad redundant rows (e.g., redundant rows used for a repair which are now themselves defective) as indicated by the bad redundant logic 342. The bad redundant latch bank 348 may provide a bad redundant address Hit1FBA from one of the bad redundant latches 350 to an SPPR disable circuit 346, which may perform an SPPR operation based on the provided address.

The fuse logic 300 also includes a second logic circuit 344, which may generally be referred to as an open bank logic circuit 344 and a second bank of latches 356 which may generally be referred to as the open address latch bank 354. The open address latch bank 354 may include one or more latches (e.g., open address latches) 356a-356n, which may store fuse bank addresses FBA associated with open addresses (e.g., redundant rows which have not been used for a repair operation) based on the open address logic 344. The open address latch bank 354 may provide an open address Hit2FBA to an SPPR repair circuit 352, which may perform an SPPR operation based on the provided address.

While the embodiment of FIG. 3 may include latch banks 348 and 354 each containing latch circuits 350 and 356 respectively, it should be understood that other embodiments may use any form of volatile storage element. In some embodiments, the fuse logic circuit 300 may include a single non-volatile memory bank which may store both the bad redundant addresses and the open bank addresses. In such an embodiment, additional circuits may be provided to manage storage and retrieval of the respective addresses.

The fuse logic 300 may also include a count control circuit 358, which may be coupled to the bad redundant latch bank 348 and/or the open address latch bank 354 to control which of the individual latches 350a-n and 356a-n respectively is used for storing and/or retrieving addresses. The fuse logic circuit 300 may also include one or more PPR circuits 360, which may perform one or more hard repair operations on the fuse array (e.g., fuse array 125 of FIG. 1). In some embodiments, the PPR circuit 360 may perform hard PPR operations based on one or more of the addresses stored in the latch banks 348 and/or 354.

The fuse logic circuit 300 may receive one or more enable signals Enable. In some embodiments, the Enable signal may be provided by the command decoder (e.g., command decoder 106 of FIG. 1) responsive to one or more external commands. The state of Enable may be used to control operations of the fuse logic circuit 300 during a SPPR operation. For example, Enable may include an overall enable signal, which may be active to indicate a SPPR operation. Individual enable signals may be used for each of the scan mode operation, shift mode operation, and soft send mode operation as described in more detail in FIG. 6. In some embodiments, the fuse logic circuit 300 may receive an overall enable signal, and internal logic may be used to manage the enable signals for each of the operations of the SPPR operation.

During a SPPR operation, the fuse logic 300 may receive the fuse bus FB from the fuse array (e.g., fuse array 125 of FIG. 1 and/or fuse arrays 225a-b of FIG. 2). The bad redundant logic 342 and the open logic 344 may examine the data on the data along the fuse bus FB, while the SPPR disable 346 and SPPR repair circuits 352 may change the data on the fuse bus and provide an updated fuse bus data stream xFB. The count control circuit 358 may include a counter which increments each time an SPPR operation is performed. The value of the count may be used to determine which latch of the latch banks 348 and 352 to store addresses in. In some embodiments, the count control circuit 358 may increment the counter each time an SPPR operation ends.

The bad redundant logic 342 may receive a row address RA which is associated with a bad row of memory. The row address RA may be stored in a latch circuit of the fuse logic circuit 300, outside of either of the latch banks 348, 354. The row address RA may be provided from outside the fuse logic. For example, logic of the memory device may identify a bad row of memory, and provide the RA associated with that bad row of memory. In some embodiments, external testing may determine a bad row, and the RA may be provided as part of an external repair command.

An SPPR operation may include a scan mode operation, which may involve the fuse array broadcasting addresses along the fuse bus. During the scan mode, the bad redundant logic 342 may compare the RA to the addresses streaming along the FB. A match between an address on the fuse bus FB and the RA may indicate that the RA is associated with a redundant row of memory, and thus that the redundant row of memory associated with RA is itself a bad row of memory. The bad redundant logic 342 may provide the signal match at an active level to indicate that there is a match between the RA and the current address on the fuse bus FB.

The bad redundant latch bank 348 may store a fuse bank address FBA based on the state of the signal match. When match is at an active level, the current FBA may be stored in an open bad redundant latch 350a-350n within the bad redundant latch bank 348. A pointer may indicate which of the latches 350a-350n is the next one to store a FBA. The pointer may be based on a state of the count control circuit 358. The stored FBA may be associated with the address identified as a bad redundant by the bad redundant logic 342.

In addition, during the scan mode operation the open address logic 344 may scan the addresses provided on the fuse bus FB and search for an open fuse bank. The open fuse bank address may represent a redundant row which has not yet been used as part of a repair operation. The open address logic 344 may provide a signal Available at an active state to indicate that the current address on the fuse bus FB is an open address. When Available is in an active state, the open address latch bank 354 may latch a fuse bank address FBA value into one of the latches 356. The latched FBA may be associated with the open address identified by the open logic circuit 344. The FBA may be latched into one of the latches 356 of the open address fuse bank 354 which may be indicated by a pointer of the open address latch bank 354. The pointer may be based on a value stored in the count control circuit 358.

Each of the latch banks 348 and 354 may be generally similar, and so for the sake of brevity only the latch bank 348 will be described in detail. The latch bank 348 includes a plurality of volatile storage elements. In the embodiment of FIG. 3, each of the volatile storage elements may be a latch circuit 350. The latch bank 348 may be coupled to the count control circuit 358, which may control a signal (and/or a point of the latch bank 348) which indicates which of the latches 350 is the next available latch. Each of the plurality of latches 350 may be capable of storing a fuse bank address and providing the stored fuse bank address. In some embodiments, one of the plurality of latch circuits 350 may be a primary latch circuit, and only the primary latch circuit may provide addresses outside of the latch bank 348.

In some embodiments, the fuse logic circuit 300 may perform an optional shift mode operation. In some embodiments, in order save space and/or power and/or to reduce the complexity of the fuse logic circuit 300, only the primary bad redundant latch 350 and primary open address latch 356 may be coupled to the SPPR disable circuit 346 and the SPPR repair circuit 352 respectively. During the shift mode operation, data may be shifted between the different latches 350/356 of the latch banks 348/354 so that the most recently latched fuse bank address is stored in the primary latch. Since the operation may be generally similar in the bad address latch bank 348 and the open address latch bank 354, for the sake of brevity, only the operation in the bad redundant latch bank will be described in detail.

The bad redundant latch bank 348 may have some number n of latch circuits 350. The first latch circuit 350 may be the primary latch. In some embodiments, the latch circuits 350 may be organized together into a shift register. Each of the latch circuits 350 may store a fuse bank address identified as being associated with a defective row of redundant memory used in a previous repair of the bad redundant logic circuit 342. The count control circuit 358 may indicate a number of SPPR operations which have already occurred. On an ith SPPR operation, the FBA stored in the ith latch circuit 350 may be provided to the SPPR disable circuit 346 as the address Hit1FBA. Since only the address stored in the primary latch is provided as Hit1FBA, the address stored in the ith latch must be moved into the primary latch. Based on the value of the count control circuit 358, the address in the ith latch may be moved into the primary latch.

Once the scan mode (and optional shift mode) are complete, the fuse logic 300 may perform a soft send operation, where disable and/or repair operations are performed on the address provided by the bad redundant fuse bank 348 and the open address fuse bank 354 respectively. During the soft send mode, the fuse array may begin broadcasting addresses along the fuse bus FB again. This second broadcast may generally be similar to the one during the scan mode operation, except that the SPPR disable circuit 346 and the SPPR repair circuit 352 may be active instead of the bad redundant logic circuit 342 and the open address logic circuit 344.

The SPPR disable circuit 346 may examine addresses which are streaming on the fuse bus FB. The addresses on the fuse bus FB may be compared to the address Hit1FBA provided by the bad redundant latch bank 348. A match between the address on FB and Hit1FBA may indicate that the current address on FB is the previously identified bad redundant row. The SPPR disable circuit 346 may alter the address on the FB and provide an updated address on the fuse bus xFB. In particular, the SPPR disable circuit 346 may disable the address which matches Hit1FBA, the identified bad redundant row. For example, in one embodiment, the SPPR disable circuit 346 may change the state of an enable bit in the address before providing it along the updated fuse bus xFB. The SPPR disable circuit 346 may also provide the select signal which matches the row latch associated with the identified bad redundant row, such that the disabled row address is latched by the row latch.

The SPPR repair circuit 352 may examine the addresses which are streaming on the fuse bus FB and compare them to the fuse bus address Hit2FBA provided by the open address latch bank 354. A match may indicate that the current address on the fuse bus FB corresponds to an open address as previously determined by the open logic circuit 344 during the scan mode. When there is a match, the SPPR repair circuit 352 may repair the provided row address RA by mapping it onto the open address. The SPPR repair circuit 352 may also provide a select signal corresponding to the row latch associated with the repair, such that the row address RA is latched by the associated row latch. In some embodiments, the SPPR repair circuit 352 may replace the value of the open address on the fuse bus FB with the row address RA, and then may provide RA as part of the updated fuse bus xFB. RA may then be latched in row latch (e.g., row latch 119 of FIG. 1 and/or 219 of FIG. 2) that was previously associated with Hit2FBA such that RA is now associated with that redundant row of memory.

In some embodiments the fuse logic circuit 300 may also include PPR circuits 360. The PPR circuits 360 may be used to perform a hard repair, by blowing one or more fuses/antifuses in the fuse array. In some embodiments, the PPR circuits 360 may perform hard repairs based on the addresses stored in the bad redundant latch bank 348 and/or open address latch bank 354. In some embodiments, the count control circuit 358 may determine when a number of SPPR operations have been performed such that all of the latches in the latch banks 348 and/or 354 are full. The PPR circuit 360 may then be triggered to perform a hard repair on the addresses stored in those banks. In some embodiments, the latch banks 348 and 354 may be cleared (e.g., the addresses in the latches 350 and 356 may be removed) once a hard repair has been made based on the addresses in the latch banks 348 and 354.

Figure 4:
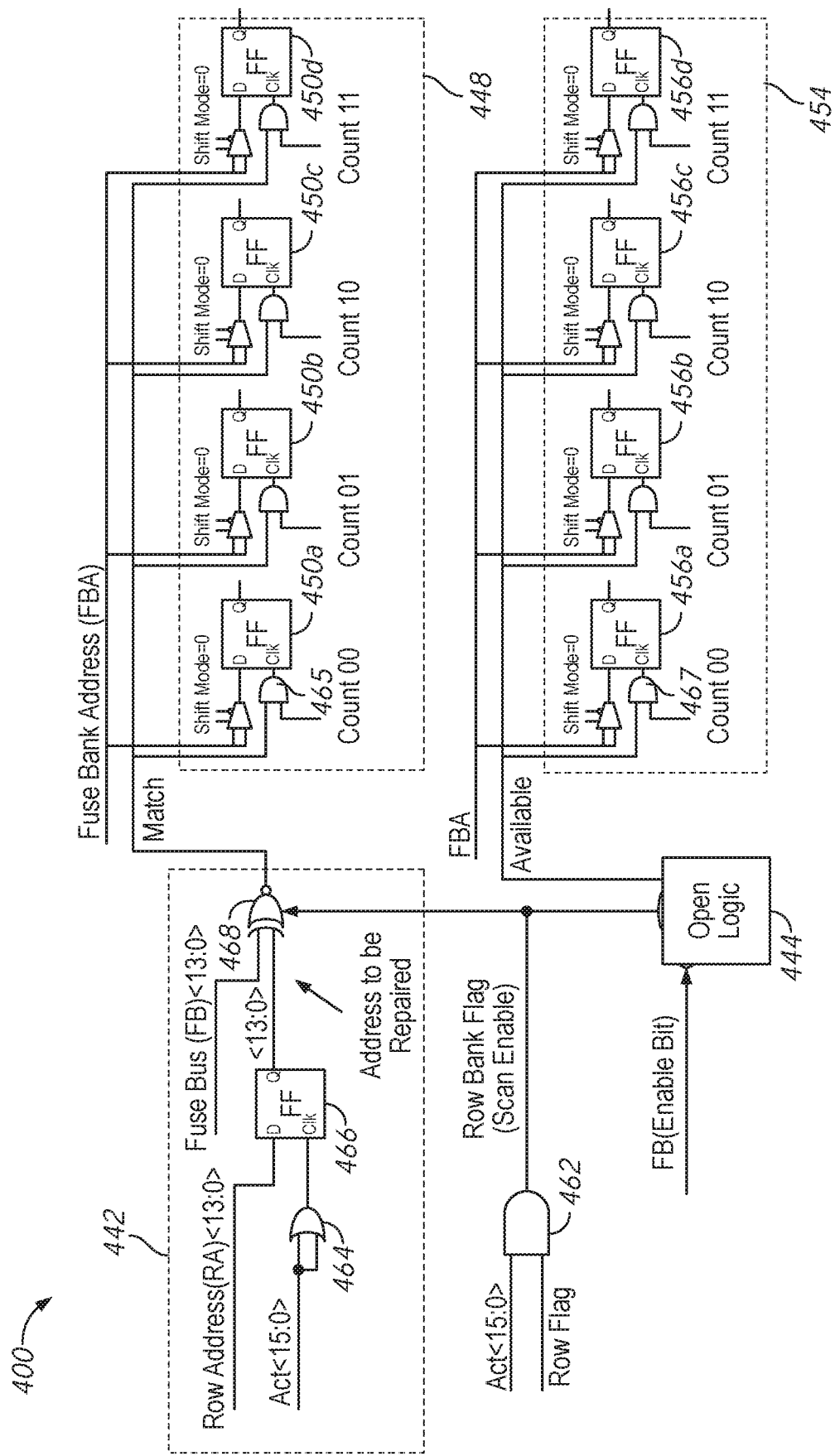
FIG. 4 is a schematic diagram of a fuse logic circuit according to an embodiment of the present disclosure.

FIG. 4 is a schematic diagram of a fuse logic circuit according to an embodiment of the present disclosure. The fuse logic circuit 400 may represent an implementation of a portion of the fuse logic circuit 300 of FIG. 3. In particular, the fuse logic circuit 400 may show certain components used during a scan mode operation, such as bad redundant logic 442, open address logic 444, bad redundant fuse bank 448

(and latches 450), and open address fuse bank 454 (and latches 456). The bad redundant logic circuit 442 includes an OR gate 464, a latch 466, and an XNOR gate 468. The open address logic circuit 444 and the bad redundant logic circuit 442 may both be coupled to an enable signal, which may be provided by an AND gate 462.

The AND gate 462 may receive a row flag signal, and the bank activation signal Act. The row flag signal may be a select signal which, when it is in an active state indicates that the data along the fuse bus FB is associated with the row latches (e.g., row latches 119 of FIG. 1 and/or 219 of FIG. 2). The bank activation signal Act may be in an active state to indicate that operations are being performed on a bank of the memory. When both the row flag and Act are active, the AND gate 462 may provide the enable signal at an active level.

The bad redundant logic circuit 442 receives a row address RA, which indicates a row of memory to be repaired, and the bank activation signal Act. The OR gate 464 may determine if Act indicates that one or more banks is being accessed by determining if at least one bit of Act is at a high logical level. If so, then the latch circuit 466 may latch the current value of the row address RA. The output of the OR gate 464 may be coupled to the Clk node of the latch 466, and the row address RA may be coupled to the D node. The Q node of the latch circuit 466 may provide the latched RA and may be coupled to one of the inputs of the XNOR gate 468. The other input of the XNOR gate 468 may be coupled to the fuse bus FB. As addresses stream past on the fuse bus FB, the XNOR gate 468 may provide a signal match, with a state based on a comparison between the RA latched in latch 466 and the current value of the fuse bus FB. The XNOR gate 468 may be coupled to the enable signal, and may only compare FB and RA when the enable signal is active.

The bad address fuse bank 448 may latch a current value of the fuse bank address FBA when the match signal is active. The value of the count control circuit (e.g., count control circuit 358) may determine which of the latches 450 within the bank 448 has the FBA stored in it. Each of the latches 450 may have the output of an AND gate 465 coupled to the clock terminal of the latch 450. One input terminal of the AND gate 465 may be coupled to the match signal, and the other terminal may be coupled to a signal which is at a high logical level only when the count control circuit is at a particular value. For example, in the embodiment of FIG. 4, the bad address latch bank 448 includes four latches 450, and the count control circuit may be a two-bit count control circuit. When the count control circuit is at 00, the first AND gate 465 may receive an active signal, the second AND gate may be active when the count control circuit is at 01, etc. Thus, when the signal match is active, the current value of FBA, which is coupled to the D terminal of each of the latches 450, may be latched in whichever latch 450 is coupled to an active signal from the count control circuit.

The open address logic circuit may be active when the enable signal is active. While the enable signal is active, the open address logic circuit 444 may check an enable bit of the addresses streaming along the fuse bus FB. If the enable bit indicates that the address is enabled (e.g., open), the open logic circuit may provide the signal Available at an active level. The latches 456 of the open address latch bank 454 may function in a manner generally similar to the bad redundant latch bank 448, and for the sake of brevity the function of the open address latch bank 454 will not be described in detail herein.

Figure 5:
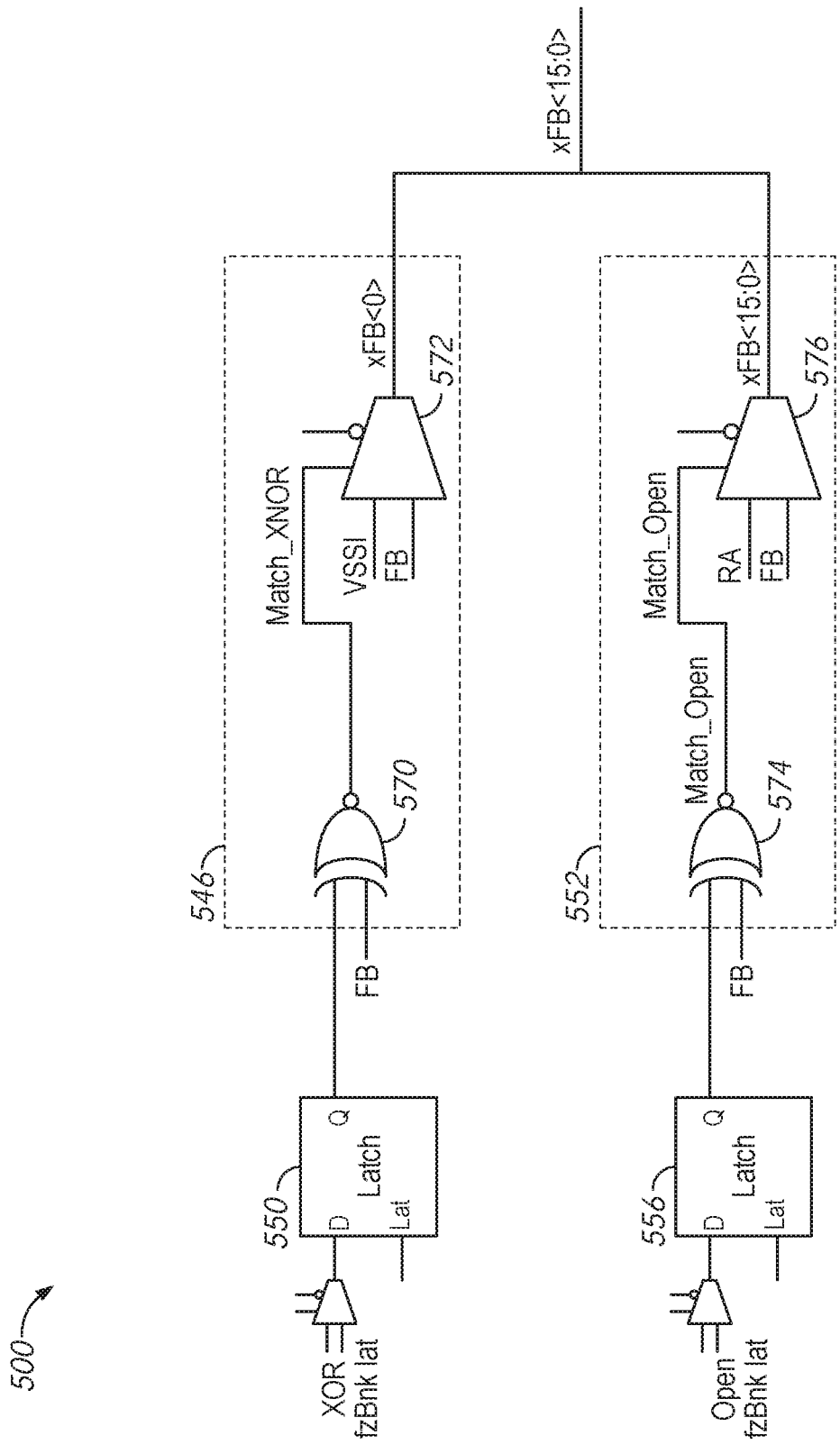
FIG. 5 shows a portion of a fuse logic circuit according to an embodiment of the present disclosure.

FIG. 5 shows a portion of a fuse logic circuit 500 according to an embodiment of the present disclosure. The fuse logic circuit 500 shows certain components which may implement components of the fuse logic circuit 126 of FIG. 1 and/or 226 of FIG. 2. In particular the fuse logic circuit 500 shows components which may be used during a soft send mode operation to perform soft repairs on the memory. The components of the fuse logic circuit 500 may work in conjunction with the components of fuse logic circuit 400 to perform an SPPR operation.

The fuse logic circuit 500 includes a bad redundant latch 550 and an open address latch 556, which may be part of a bad redundant fuse bank and open address fuse bank respectively. In some embodiments, the latches 550 and 556 may represent primary latches of the latch banks. The output terminal of the bad redundant latch 550 is coupled to an SPPR disable circuit 546, while the output terminal of the open address latch 556 is coupled to an SPPR repair circuit 552.

The SPPR disable circuit 546 includes an XNOR gate 570 which is coupled to the address stored in the latch 550 and to the fuse bus FB. When the address on the fuse bus FB matches the bad redundant address stored in the latch 550, the XNOR gate 570 may provide the signal Match_XNOR at an active level. The signal Match_XNOR being at an active level may activate the multiplexer 572. The multiplexer 572 may receive the fuse bus FB and also a system voltage VSS!. When the multiplexer 572 is activated by the signal Match_XNOR, the multiplexer 572 may change the value of an enable bit of the current address on the fuse bus FB to the value of the system voltage VSS!. This may change the state of the enable bit such that the current value of the address is now inactive. The updated address may then be provided along the updated fuse bus xFB.

The SPPR repair circuit 552 includes an XNOR gate 574 which is coupled to the fuse bus FB and to the address stored in the latch 556. When the value of the fuse bus FB matches the address in the latch 556, the XNOR gate 574 may provide the signal Match_Open at an active level. The signal Match_Open being at an active level may activate the multiplexer 576. The multiplexer 576 may be coupled to the fuse bus FB and the identified bad address RA. When the multiplexer 576 is activated, it may provide RA on the updated fuse bus xFB instead of the value that was previously on FB.

Figure 6:
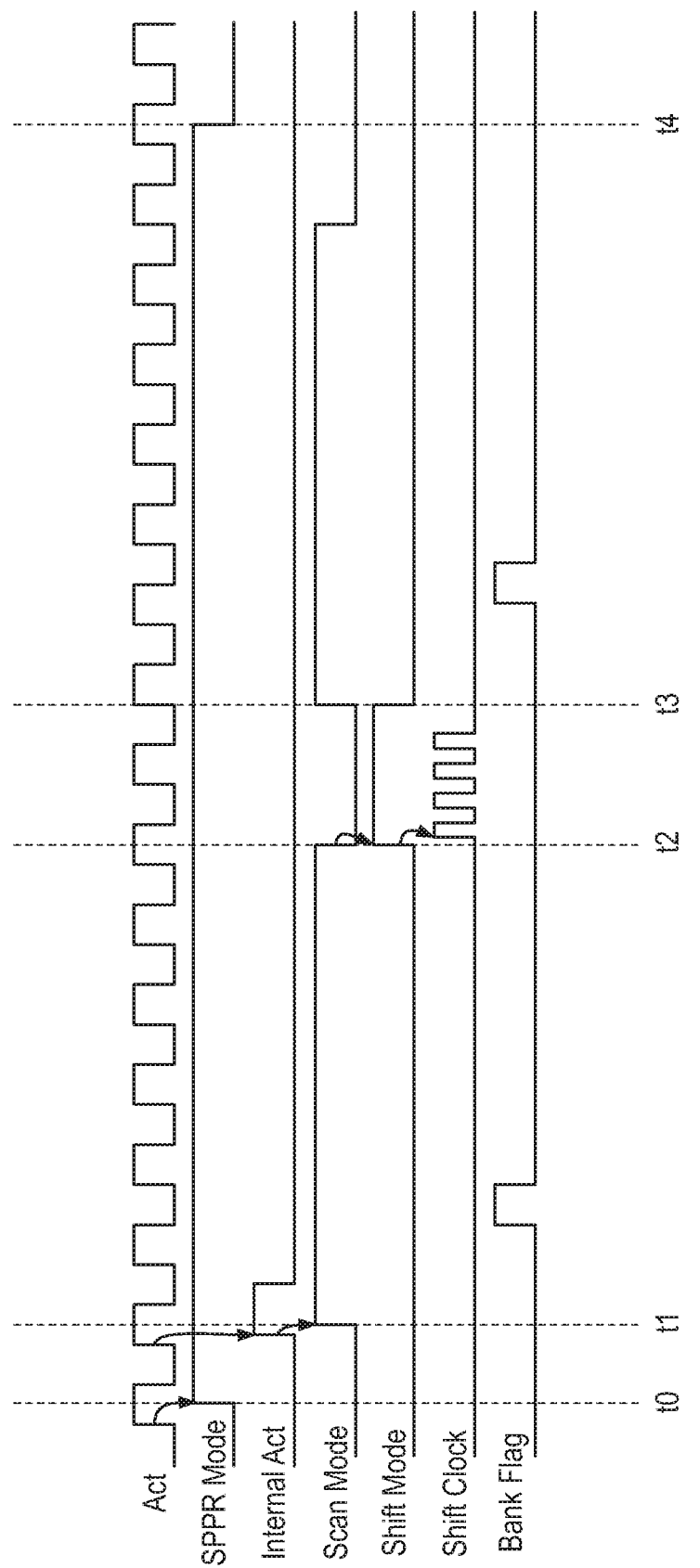
FIG. 6 is a timing chart showing signals within a fuse logic circuit during a soft post package repair operation according to an embodiment of the present disclosure.

FIG. 6 is a timing chart showing signals within a fuse logic circuit during an SPPR operation according to an embodiment of the present disclosure. The timing chart 600 represents signals which may be used in a specific embodiment of the disclosure. In particular, timing chart 600 shows signals which may be used to operate the fuse logic circuit 300 of FIG. 3. Each of the lines of the timing chart 600 has an x-axis which represents time. The y-axis represents a logical level of each of the different signals, which in the embodiment shown in FIG. 6 may be at a low logical level or a high logical level. The low logical level is shown as lower on the y-axis, while the high logical level is higher on the y-axis. The relative positions of the various signals are shown for illustrative purposes only, and the positions between different signals are not to scale. Other embodiments may have different shapes for the different signals, and different relationships between the signals.

The first line of the timing diagram 600 represents the activation command Act. During commands Act may function as a clock signal, and may switch between being at a logical low level and a logical high level. Before an initial time, t0, while Act is at a high logical level an SPPR entry command may be provided to the fuse logic circuit. Act being at the high logical level together with the SPPR entry command may initiate an SPPR operation in the fuse logic circuit.

The second line of the timing diagram represents the signal SPPR Mode, which may function as an enable signal. After receiving the SPPR entry command, at the initial time t0, the SPPR Mode signal may be raised to a high logical level. SPPR Mode may function as an enable signal for the overall SPPR operation.

The third line of the timing diagram 600 represents an internal activation signal Internal Act. After t0, while SPPR Mode is active (in this case, at a high logical level) a subsequent activation of Act may cause Internal Act to activate and rise to a high logical level. Internal Act being at a high logical level may cause the fuse logic circuit to latch a provided row address RA. For example Internal Act may be coupled to a latch, such as the latch 466 of FIG. 4, to store a current value of the provided row address RA, which indicates a bad row of memory. The signal Internal Act may rise to a high logical level for a set period of time, and then return to an inactive state (e.g., a low logical level) for the remainder of the SPPR operation.

The fourth line of the timing diagram 600 represents the signal ScanMode, which may be used to enable the ScanMode and the Soft Send mode of the fuse logic. At a first time t1, after the initial time t0, ScanMode may be activated and raised from a low logical level to a high logical level. ScanMode may be activated after Internal Act is activated to latch the row address RA. At t1, after ScanMode is activated, the fuse array may begin broadcasting addresses along the fuse bus. During the scan mode initialized by the first activation of ScanMode, the addresses on the fuse bus may be examined to determine if any represent a bad redundant and/or an open address.

The fifth line of the timing diagram 600 represents a signal ShiftMode, which may be used to enable the shift mode of the fuse logic circuit. At a second time t2, which is after t1, the scan mode may end, and the signal ScanMode may return to a low logical level. The falling edge of ScanMode may trigger ShiftMode to rise to a high logical level. While ShiftMode is at a high logical level, the fuse logic may perform one or more shift operations to move data between the latches of the latch banks (e.g., bad redundant latch bank 348 of FIG. 3 and/or open address latch bank 354 of FIG. 3) such that the address for the current SPPR operation is in the primary latch.

The sixth line of the timing diagram 600 represents a signal Shift Clock, which may be used to control the shifting of addresses in the latch banks. Based on a number of previous SPPR operations, which may be stored in a count control circuit (e.g., count control circuit 358 of FIG. 3), the Shift Clock may activate with a certain number of pulses. Each pulse of Shift Clock may move the data to a next lower latch (e.g., from latch n to latch n−1). In the example shown in FIG. 6, four previous SPPR operations have occurred, and so the Shift Clock may have four sequential pulses to move data from the fourth latch circuit into the primary latch circuit.

At a third time t3, the shift mode may conclude, and the signal ShiftMode may return to a low logical level. This may cause the signal ScanMode to activate a second time and return to a high logical level. The second activation of ScanMode during a given SPPR operation may cause the fuse logic circuit to perform a Soft Send Operation. During the soft send operation, the fuse array may begin a second broadcast of addresses along the fuse bus. The fuse logic may perform a repair operation and/or disable a bad redundant row, based on matching the address stored in the latch bank (e.g., in the primary latch) to an address on the fuse bus, and then altering that address to provide an updated fuse bus.

The seventh line of the timing diagram 600 represents a bank flag signal Bank Flag. Bank Flag may be active to indicate that the data streaming along the fuse bus is associated with the banks. When the bank flag is in an active state during the scan mode (e.g., between t1 and t2) an open fuse bank address and a bad redundant fuse bank address may be latched in their respective latch banks. When the bank flag is in an active state during the soft send operation (e.g., between t3 and t4), updated data (e.g., a new address, a change of state in the enable bit) may be multiplexed onto the fuse bus for the addresses latched during the scan mode.

At a fourth time t4, which is after the third time t3, the SPPR operation may end, and the signal SPPR Mode may return to a low logical level. The falling edge of SPPR Mode may trigger the count control circuit to increment a value of a counter which tracks the number of SPPR operations.

Figure 7:
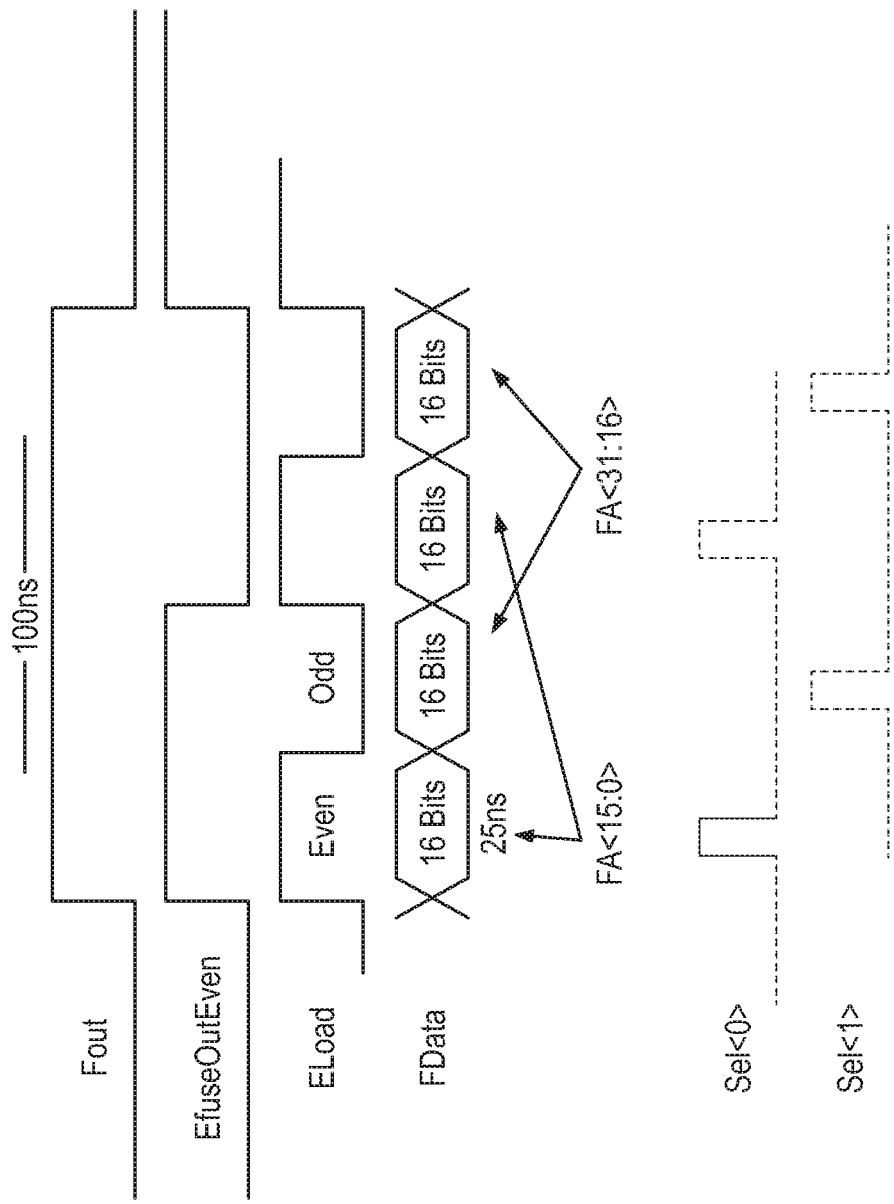
FIG. 7 is a timing diagram of signals along a fuse bus according to an embodiment of the present disclosure.

FIG. 7 is a timing diagram of signals along a fuse bus according to an embodiment of the present disclosure. The timing diagram 700 represents signals which may be used as part of the fuse bus. The x-axis of the timing diagram may represent time, while the y-axis (except for FData, as discussed herein) may represent a logical state of the signal. The timing diagram 700 may represent an example fuse bus, which may involve data from a first fuse array (e.g., fuse array 225a of FIG. 2) and a second fuse array (e.g., fuse array 225b of FIG. 2). The addresses from the first and the second fuse array may generally be referred to as 'even' and 'odd' addresses, although it should be understood that the actual numerical values of both the even and odd addresses may include even and odd numbers. For brevity, the timing diagram 700 may involve a simplified fuse bus, with only four addresses transmitted along it. Certain signals may be simplified, since there are only four addresses (e.g., the select signals Sel<0> and Sel<1>).

The first line of the timing diagram 700 represents a signal Fout, which may indicate that data is being streamed along the fuse bus. Fout may be at a high logical level when data is provided on the fuse bus, and at a low logical level otherwise. The second line of the timing diagram EfuseOutEven represents a signal which may be used to help identify a source of the data on the fuse bus. In this embodiment, EfuseOutEven may switch states every time that a pair of data packets is provided on the fuse bus. The signal may start at a low logical level, and rise to a high logical level when Fout rises to a high logical level. EfuseOutEven may then stay at a high logical level for two data packets, then switch to a low logical level, and then switch back to a high logical level after two more data packets. The third line of the timing diagram 700 is a signal ELoad, which represents whether a given data packet came from the even fuse array (e.g., the inverting fuse array) or the odd fuse array (e.g., the non-inverting fuse array). The signal may be at a high logical level for even addresses, and at a low logical level for odd addresses.

The fourth line of the timing diagram 700 is the signal FData, which represents packets of data being streamed on the fuse bus. Each packet of data may represent a group of bits, which together represent a piece of information. In the example of FIG. 7, the packets are each 16 bits, and may represent an address. Each packet of data may have come from either the first or the second fuse array, and may be alternated and combined onto a single stream of data, FData.

The fifth and sixth lines of the timing diagram 700 represent a select signal Sel<0> and Sel<1>. The select signals may be used to indicate where the data packets in FData are used. For example, the select signals may indicate which latch of a set of row latches (e.g., row latches 119 of FIG. 1 and/or 219 of FIG. 2). During a scan mode operation, all of the select signals may be suppressed, and no data on the row latches may be changed. During a soft send operation, only the select signal corresponding to data which has been changed (e.g., repaired or disabled) is not suppressed. Schematically this is represented in the timing diagram 700 by all the select signals except the first being dotted lines. The signals shown as dotted lines may be suppressed, and the data packets on FData may not alter their respective latches. The first data packet on FData may be latched in its respective row latch, because its associated select signal is not suppressed.

Figure 8:
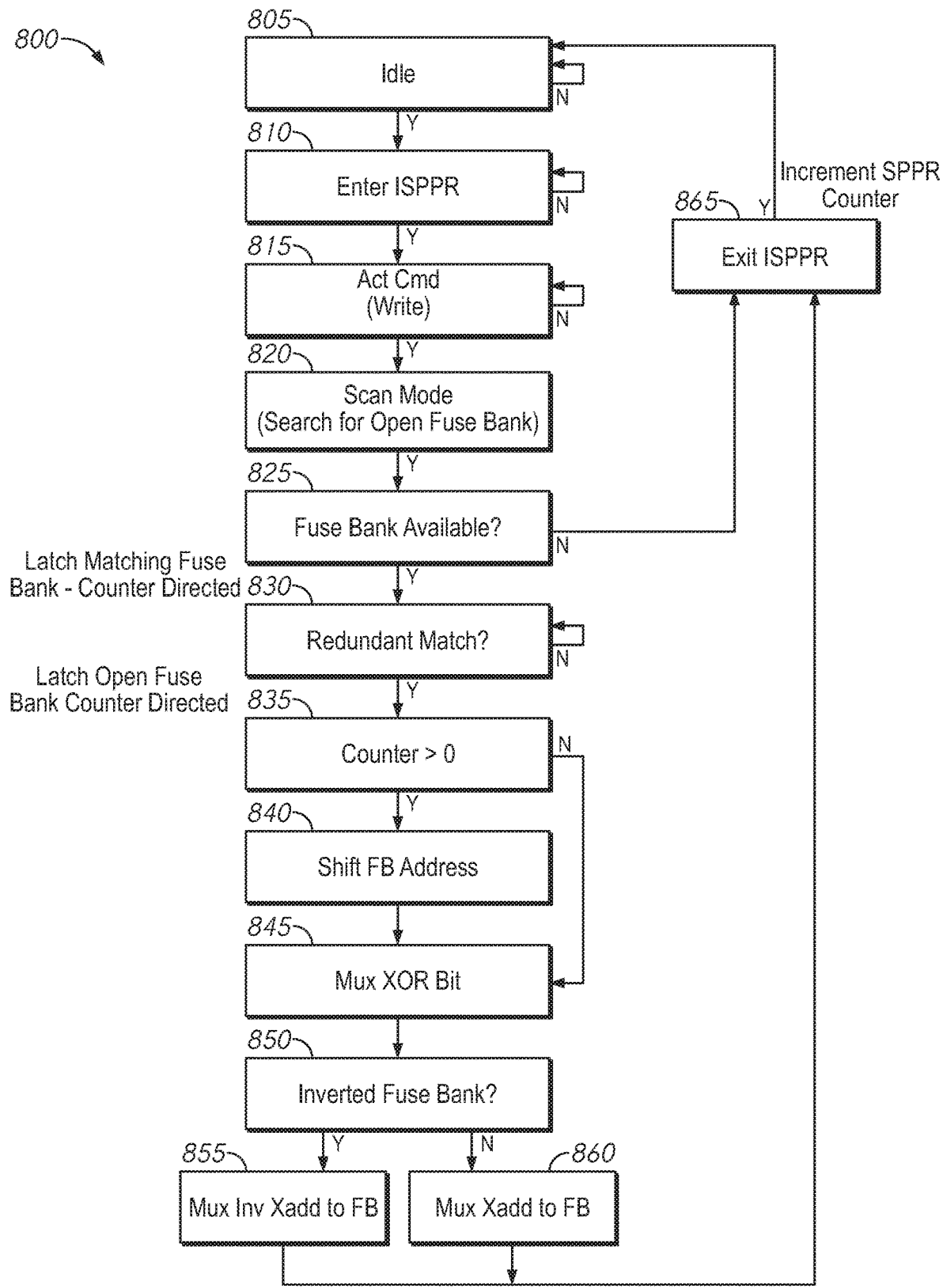
FIG. 8 is a flow chart representing a method of performing a soft post package repair operation according to an embodiment of the present disclosure.

FIG. 8 is a flow chart representing a method of performing a softsoft post package repair operation according to an embodiment of the present disclosure. The method 800 may be operated by the device 100 of FIG. 1 and/or by any of the other components described herein. Each of the blocks shown as part of the method may represent instructions such as logical checks and/or other actions that a memory device may perform as part of carrying out an SPPR operation.

The method 800 begins with block 805 which describes a check to determine if the memory device is in an idle state. If the memory device is not in an idle state, then the block 805 may be repeated. If the device is in an idle state, then the method 800 may proceed to block 810, which describes entering an SPPR mode. The device may enter an SPPR mode based on receiving a command signal to enter the SPPR mode. If no such command is received, then the block 810 may be repeated (and/or the block 805 may be repeated if the device stops being in an idle state). If an SPPR command is received, then an enable signal, such as the SPPR Mode signal of FIG. 6 may be activated. The method 800 may then proceed to block 815. Block 815 describes waiting for an activation command Act. The memory device may wait until a memory bank is activated by Act to begin performing other functions of the SPPR operation. In some embodiments, receiving an SPPR command may cause the memory device to issue an Act command. In some embodiments, Act may generate an internal activation of a fuse logic circuit of the memory (e.g., fuse logic circuit 126 of FIG. 1) which may latch a row address RA to be repaired (e.g., in latch 466 of FIG. 4).

After block 815 (e.g., after receiving both an SPPR command and Act), the method 800 may generally proceed to block 820, which describes a scan mode. During the scan mode, the fuse array may begin a broadcast operation, where information is streamed to the memory array along a fuse bus. The fuse logic circuit may examine addresses along the fuse bus to determine if there is an available fuse bank (e.g., a fuse bank which has not previously been used for a repair operation) and if there is a match between the identified row address RA and a previously repaired row (which may indicate a bad redundant row). Block 825 describes searching for an open fuse bank, while block 830 describes searching for a bad redundant. As shown in the method 800, blocks 825 and block 830 may happen sequentially. In some embodiments, the blocks 825 and 830 may generally happen simultaneously.

Block 825 describes determining if a fuse bank is available. This may involve scanning the addresses that pass on fuse bus and determining an enable state of the address. In some embodiments, this may involve checking the state of one or more enable bits of the address. If none of the fuse banks are available, (e.g., because every row of memory has already been used for a previous repair and/or disabled as a bad row of redundant memory) then the method 800 may proceed to block 865, which exits the SPPR operation (and also increments a count of the number of SPPR operations). If a fuse bank is available, its fuse bank address may be stored in a non-volatile memory element, such as in a latch in an open address latch bank. The particular latch that the fuse bank address is stored in may be based on the value of a counter, which may count the number of previous SPPR operations.

Block 830 describes determining if the current provided row address RA identifies a bad redundant row of memory. The identified row address RA of a bad row may be compared to the addresses streaming on the fuse bus. If there is a match, then the address may indicate a bad redundant row of memory. If so, then a fuse bank address associated with the bad redundant row of memory may be stored in a latch circuit of a bad redundant latch bank. The particular latch used to store the bad redundant fuse bank address may be based on the value of the counter.

Blocks 835 and 840 describe a shift mode operation. In block 835, the value of the counter may be checked to determine if it is greater than 0 (e.g., if this is the first SPPR operation or not). If the value of the counter is not greater than 0, then block 840 may be skipped, and the method may proceed to block 845. If the value is greater than 0, then the method 800 may proceed to block 850, which describes shifting fuse bank addresses within the latch banks. The addresses stored in the latch circuits may be shifted to a next previous latch circuit a number of times equal to the number of previous SPPR operations. This may move the address stored in blocks 825 or 830 into a primary latch circuit of the latch bank. The method may then proceed to block 845.

Blocks 845 to 860 may describe a soft send operation. During the soft send operation, the fuse bank may begin broadcasting addresses again along the fuse bus. In block 845, the bad redundant row identified in block 830 may be disabled. The address on the fuse bus which matches the previously identified bad redundant row stored in the latches may be identified, and the state of the enable bit(s) may be changed to mark the row as disabled. This may be done by multiplexing a system voltage (e.g., VSS) onto the enable bit.

Block 850 describes determining if the address identified as being an open address is an inverting address or a non-inverting address. If the address is a non-inverting address, then the method 800 may proceed to block 860, where the identified row address RA is multiplexed onto the fuse bus in place of the identified open address. If the address is an inverting address, then the method 800 may proceed to block 855, where the identified row address RA is inverted, and then multiplexed onto the fuse bus in place of the identified open address.

After either of blocks 855 or 860, the method 800 may proceed to block 865, which may exit the SPPR mode. This may increment a value of a counter and return the memory device to an idle state, which may allow the method to restart again at block 805.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a latch bank comprising a plurality of latch circuits, each of the plurality of latch circuits configured to store a fuse bank address;
a logic circuit configured to receive addresses along a fuse bus, the logic circuit configured to provide a command signal to the latch bank having a level based on a value of an address on the fuse bus, wherein responsive to the command signal, the latch bank is configured to store a fuse bank address associated with the address on the fuse bus in one of the plurality of latch circuits; and
a soft post-package repair (SPPR) circuit configured to determine when an address along the fuse bus matches a latched fuse bank address provided by the latch bank and alter the address before providing the altered address along the fuse bus.

2. The apparatus of claim 1, wherein the logic circuit is an open address logic circuit configured to provide the command signal at an active level when the address along the fuse bus is associated with an open fuse bank.

3. The apparatus of claim 2, wherein the SPPR circuit is configured to determine when the address along the fuse bus matches the latched fuse bank address and provide a bad row address to the fuse bus instead of the address on the fuse bus.

4. The apparatus of claim 1, wherein the logic circuit is configured to provide the command signal at an active level when the address along the fuse bus matches a bad row address.

5. The apparatus of claim 4, wherein the SPPR circuit is configured to determine when the address along the fuse bus matches the latched fuse bank address and disable one or more enable bits of the address before providing it to the fuse bus.

6. The apparatus of claim 1, wherein the plurality of latch circuits comprises a primary latch circuit configured to provide a fuse bank address stored in the primary latch circuit as the latched fuse bank address to the soft post-package repair circuit.

7. The apparatus of claim 6, further comprising a count control circuit configured to count a number of SPPR operations performed by the apparatus.

8. The apparatus of claim 7, wherein the latch bank is configured to shift a most recently stored address into the primary latch circuit based on a value of the count in the count control circuit before the SPPR circuit determines if the address along the fuse bus matches the latched fuse bank address.

* * * * *